(12) United States Patent
Matsuzawa et al.

(10) Patent No.: US 8,100,706 B2
(45) Date of Patent: Jan. 24, 2012

(54) BACK PLUG-IN CONNECTOR DEVICE

(75) Inventors: Tadashi Matsuzawa, Tokyo (JP);
Keijirou Kadomatsu, Tokyo (JP)

(73) Assignees: NEC Corporation, Tokyo (JP); NEC Engineering, Ltd., Tokyo (JP)

( * ) Notice: Subject to any disclaimer, the term of this patent is extended or adjusted under 35 U.S.C. 154(b) by 0 days.

(21) Appl. No.: 12/450,516

(22) PCT Filed: Apr. 3, 2008

(86) PCT No.: PCT/JP2008/056706
§ 371 (c)(1),
(2), (4) Date: Sep. 29, 2009

(87) PCT Pub. No.: WO2008/123587
PCT Pub. Date: Oct. 16, 2008

(65) Prior Publication Data
US 2010/0055951 A1  Mar. 4, 2010

(30) Foreign Application Priority Data

Apr. 4, 2007  (JP) ................................ 2007-098338

(51) Int. Cl.
*H01R 13/64* (2006.01)
(52) U.S. Cl. ...................... 439/247; 438/248
(58) Field of Classification Search ........... 439/246–248
See application file for complete search history.

(56) References Cited

U.S. PATENT DOCUMENTS

| 4,921,435 | A | * | 5/1990 | Kane et al. | 439/248 |
| 4,934,943 | A | * | 6/1990 | Klein et al. | 439/248 |
| 4,978,313 | A | * | 12/1990 | Kameyama et al. | 439/248 |
| 5,091,826 | A | * | 2/1992 | Arnett et al. | 361/776 |
| 5,249,978 | A | * | 10/1993 | Gazda et al. | 439/246 |
| 5,406,450 | A | * | 4/1995 | Shieh | 361/679.37 |
| 5,588,857 | A | * | 12/1996 | Feldmeier et al. | 439/248 |
| 5,921,796 | A | | 7/1999 | Morlion et al. | |
| 5,964,595 | A | * | 10/1999 | Centofante | 439/76.1 |
| 5,993,241 | A | * | 11/1999 | Olson et al. | 439/248 |
| 6,062,872 | A | * | 5/2000 | Strange et al. | 439/248 |
| 6,159,030 | A | * | 12/2000 | Gawron et al. | 439/247 |
| 6,322,382 | B1 | * | 11/2001 | Viallet | 439/248 |
| 6,527,572 | B2 | * | 3/2003 | Jou | 439/248 |
| 6,956,388 | B2 | * | 10/2005 | Hwang | 324/758 |

FOREIGN PATENT DOCUMENTS

| JP | 64-027982 | 2/1989 |
| JP | 04-076279 | 7/1992 |
| JP | 07-201411 | 8/1995 |
| JP | 10-050400 | 2/1998 |
| JP | 2004-022270 | 1/2004 |
| JP | 2004-055285 | 2/2004 |

* cited by examiner

*Primary Examiner* — Briggitte R Hammond
(74) *Attorney, Agent, or Firm* — Foley & Lardner LLP

(57) ABSTRACT

A back plug-in connector device having a floating structure, comprises: a body chassis, a cover and a support plate on which a connector is mounted. The support plate is sandwiched by the body chassis and the cover so as to constitute the floating structure.

8 Claims, 6 Drawing Sheets

BACK PLUG-IN CONNECTOR DEVICE

REFERENCE TO RELATED APPLICATION

This application is the National Phase of PCT/JP2008/056706, filed Apr. 3, 2008, which claims the benefit of the priority of Japanese patent application No. 2007-098338, filed on Apr. 4, 2007, the disclosures of which are incorporated herein in their entirety by reference thereto.

TECHNICAL FIELD

This invention relates to a back plug-in connector device, and particularly relates to a back plug-in connector device having a floating structure.

BACKGROUND ART

Various kinds of connector devices each having a floating structure have been disclosed. For example, a structure of a conventional commercial back plug-in connector is shown in FIG. 6. The connector comprises a connector (backboard side) 21 having a guide projection for positioning and a connector part 22 having a guide hole, and a fixation screw hole of the connector part is floating.

Patent Document 1 discloses a connector having an engaging latch on a connector and an engaging hole on a panel (attached portion) so as to make a simpler floating structure.

Patent Document 2 discloses a connector structure floating in a plug-in direction by providing an intervening elastic support strip (leaf spring, for example) instead of attaching a connector directly to a cabinet or unit. The structure has its purpose to prevent a breakage of the connector by an engaging gap, etc. caused by a deformation of the elastic support strip.

Patent Document 3 discloses a connector device of which a floating portion and a guide pin are combined so as to achieve a simpler structure and a smaller number of components.

Patent Document 1:
 JP Utility Model Kokai Publication No. JP-U-04-76279
Patent Document 2:
 JP Patent Kokai Publication No. JP-P2004-22270A.
Patent Document 3:
 JP Patent Kokai Publication No. JP-P2004-55285A.

SUMMARY

The entire disclosures of Patent Documents 1 to 3 are incorporated herein by reference thereto. The following analyses are given by the present invention.

A first problem of the structure of the conventional back plug-in connector shown in FIG. 6 is that a required number of terminal pins is only about 24 at largest. A second problem of the commercial back plug-in connector is that the structure becomes complicated and thus high cost because floating bushes and guide pins etc. are provided.

The structure disclosed in Patent Document 1 has a problem of high cost because a complicated engaging latch is provided on the connector and the correspondent engaging hole is necessary on the plate.

A first problem of the structure disclosed in Patent Document 2 is that there is a possibility of breakage of the connector after repeated plug in and out caused by an engaging gap due to a plastic deformation of the elastic support strip. A second problem is that various kinds of designs of the elastic support strips are needed corresponding to design differences of the connectors such as a number of pins, etc. to prevent plastic deformation of the support strip.

The device disclosed in Patent Document 3 has a structure such that a floating plate is connected to the connector and positioning pins with intervening side plate of a shelf. The structure is not simple enough and a floating in a plug-in direction is not capable.

It is an object of the present invention to provide a back plug-in connector device which is easy to fabricate due to a simple structure, enables a smooth three-dimensional floating, reduces maintenance such as replacement caused by connector damage and reduces fabrication cost.

According to a first aspect of the present invention, a back plug-in connector device having a floating structure comprises a body chassis, a cover and a support plate on which a connector is mounted, and the support plate is sandwiched by the body chassis and the cover so as to constitute the floating structure.

A first effect of the present invention is that a three-dimensional floating can be realized and a high productivity can be obtained at a low cost. The reason is that the structure is simpler than conventional connectors, an assembling from one direction becomes possible and a number of screws can be reduced.

A second effect of the present invention is that smoother floating is realized compared to conventional connectors. The reason is that a friction coefficient during the three-dimensional floating between a groove portion of the body chassis and a projection portion of the floating support plate can be reduced.

A third effect of the present invention is that frequency of maintenance such as a replacement of the connector caused by a connector breakage can be reduced.

Preferred Modes

Exemplary embodiments of the present invention are as follows. In a second aspect of the present invention, a projection portion is provided on an edge surface portion of the support plate and a groove portion which engages the projection portion with a necessary clearance is provided on the body chassis.

In a third aspect of the present invention, the floating structure is constituted such that the support plate having the projection portion is fitted into the body chassis having the groove portion and that the cover is fixed to the body chassis from the same direction so as to sandwich the support plate.

In a fourth aspect of the present invention, the projection portion is cylinder-shaped.

In a fifth aspect of the present invention, an end portion of the cylinder-shaped projection portion is sphere-shaped or semi-sphere-shaped.

In a sixth aspect of the present invention, at least one projection portion which engages the groove portion is provided on each edge surface of the edge surface portion of the support plate.

In a seventh aspect of the present invention, a concave-shaped guide receiving portion for positioning at plug-in is provided on the support plate such that the guide receiving portion engages a convex-shaped guide member provided on a backboard of a cabinet side.

The body chassis and the cover constitute parts of a structure of a unit. A person skilled in the art can obtain necessary designed quantity of floating (play) to connect the connectors by adjusting a size difference (clearance) between the projection portion and the groove portion.

EXEMPLARY EMBODIMENT

An exemplary embodiment of the present invention will be explained.

Figure 2:
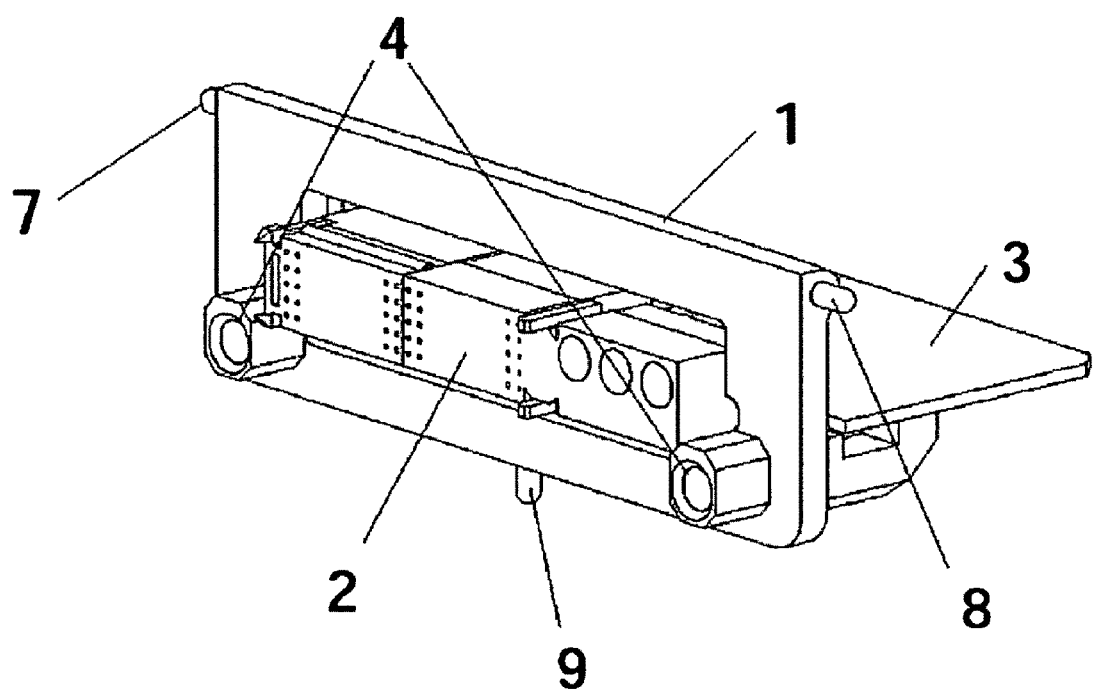
FIG. 2 is an entire perspective view of a support plate 1 on which a connector 2 is mounted.

FIG. 2 shows an entire perspective view of a support plate 1 on which a connector 2 is mounted. A sub-board 3 on which the connector 2, which requires an electric connection, is mounted is attached on the support plate 1. A projection portion 7 of left side edge surface is provided on a left side edge surface of the support plate 1. Also a projection portion 8 of right side edge surface and a projection portion 9 of lower side edge surface are provided on a right side edge surface and lower side edge surface of the support plate 1, respectively. Two concave-shaped guide receiving portions 4 are provided on both sides of the connector 2 so as to engage convex-shaped guide members 20 provided on a backboard 18 described below.

Figure 3:
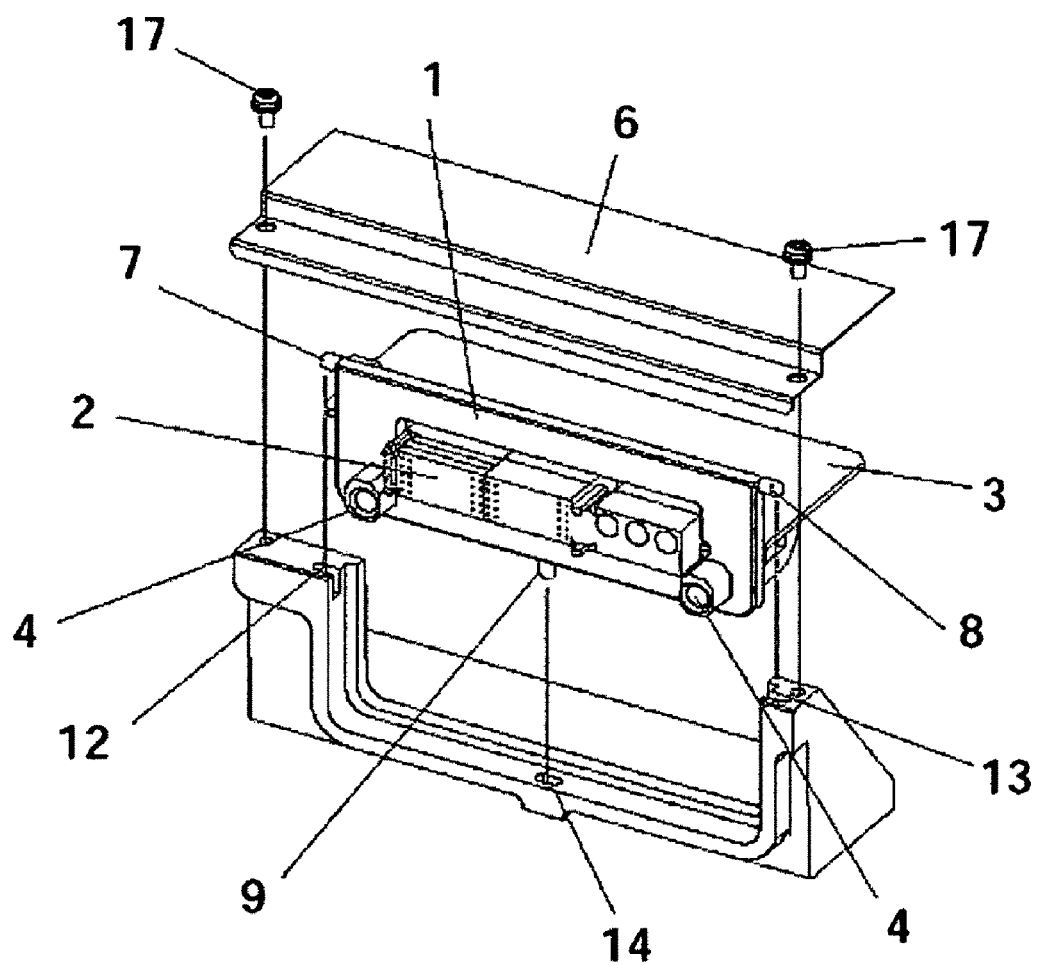
FIG. 3 is an assembly drawing illustrating a structure in which the support plate 1 mounting the connector 2 is sandwiched by a body chassis 5 and a cover 6.

FIG. 3 is an assembly drawing illustrating a structure in which the support plate 1 mounting the connector 2 is sandwiched by a body chassis 5 and a cover 6. The body chassis and the cover are parts of a structure of a unit 15. A center portion of the body chassis 5 is cut out to fit an external size of the support plate 1, and a groove portion 12 of left lateral side surface, a groove portion 13 of right lateral side surface and a groove portion 14 of lower surface are provided at both of the lateral side portions and the lower surface portion of the cut out portion, respectively. The groove portions 12, 13 and 14 are provided at positions such that they engage the projection portions 7, 8 and 9 of the support plate 1, respectively, when the support plate 1 is inserted into the body chassis 5 from the top. Required (necessary) quantity of three dimensional floating, that is, right and left, up and down and plug-in and out directions, can be obtained by arranging widths, heights and depths of the groove portions 12, 13 and 14 and shapes and sizes of the engaging projection portions 7, 8 and 9, respectively.

The shapes of the projection portions 7, 8 and 9 can be freely chosen in combination with the shapes and sizes of the engaging groove portions 12, 13 and 14; however, cylindrical shape is preferable so that the support plate 1 will float smoothly by a reduced contacting friction. Preferably a shape of an end portion of the cylinder is substantially sphere-shaped or semi-sphere-shaped by the same reason. The shape of the groove portions 12, 13 and 14 may be rectangular parallelepiped or a curved surface having a different radius of curvature from a radius of the cylinder or a radius of sphere at the end of the cylinder.

According to the structure, a commercial connector can be used as a floating connector by only attaching the commercial connector to the support plate and sandwich it by the body chassis and the cover. Therefore, various kinds of connectors are available by changing a design of the sub-board.

As shown in FIG. 3, it is preferable to insert the support plate 1 mounting the connector 2 into the body chassis 5, put the cover 6 on it from the same direction and fix by screws, etc. According to the structure, it makes possible to reduce components of a connector device having a floating structure and also it becomes possible to fabricate the connector from one direction, therefore, a production steps can be simplified. Thus fabrication costs can be reduced.

Figure 1:
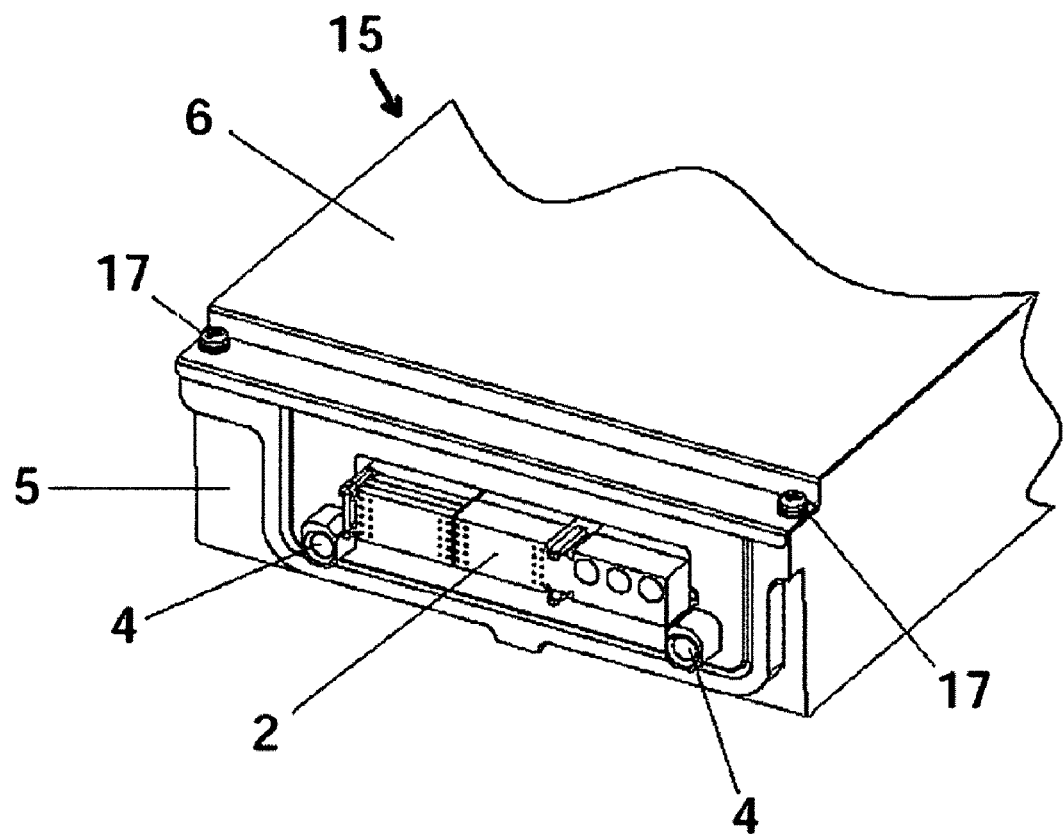
FIG. 1 is an entire perspective view of a back plug-in connector device having a floating structure after assembling.

FIG. 1 is an entire perspective view of the back plug-in connector device having the floating structure assembled above explained method. According to the above explained structure, the support plate 1 is sandwiched by the body chassis 5 and the cover 6 with a required clearance and the back plug-in connector having the floating structure can be easily assembled.

The support plate 1 and the cover 6 are assembled from the top side in an example shown in FIG. 3; however, it may be possible to assemble from lateral side or lower side direction.

Figure 4:
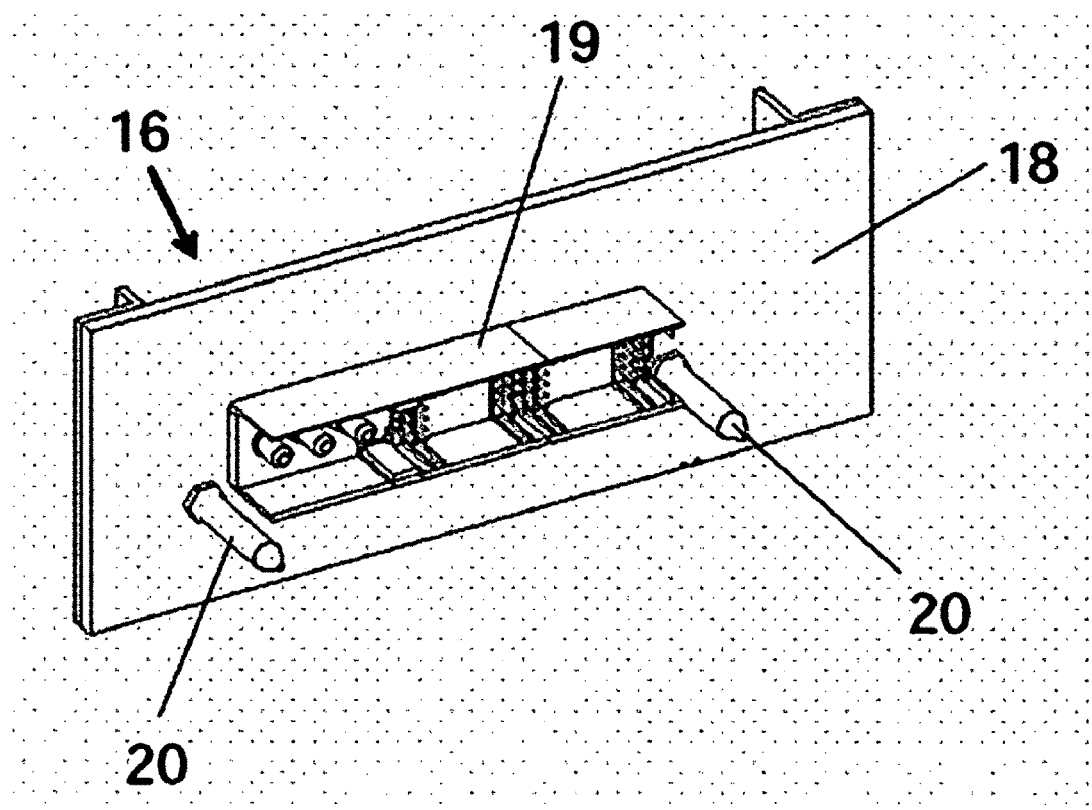
FIG. 4 is a perspective view of a backboard 18 on which a backboard connector 19 is mounted.

FIG. 4 is a perspective view of a backboard 18, of a cabinet 16 side, on which a backboard connector 19 is mounted. Two convex-shaped guide members 20 which engage concave-shaped guide receiving portions 4 provided on the support plate 1 are provided on both sides of the backboard connector 19. An engagement of the guide receiving portions 4 and the guide members 20 can absorb a dispersion of fabrication accuracy or assembling accuracy of components before fitting of both connectors as well as the floating structure. In addition it protects influences of an external force such as an impact or torsion of the connector in a state that both connectors are fitted.

Figure 5:
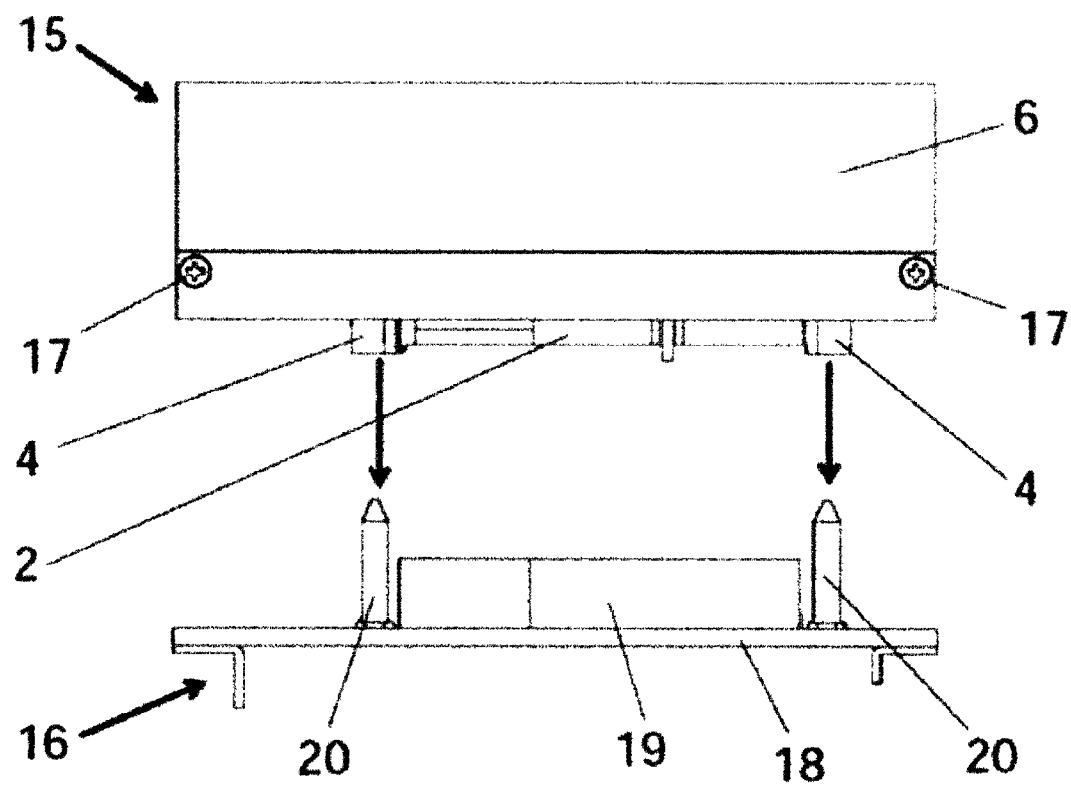
FIG. 5 is a top view in which a convex-shaped guide member 20 of the backboard 18 and a concave-shaped guide receiving portion 4 on the support plate 1 are engaging each other.
Figure 6:
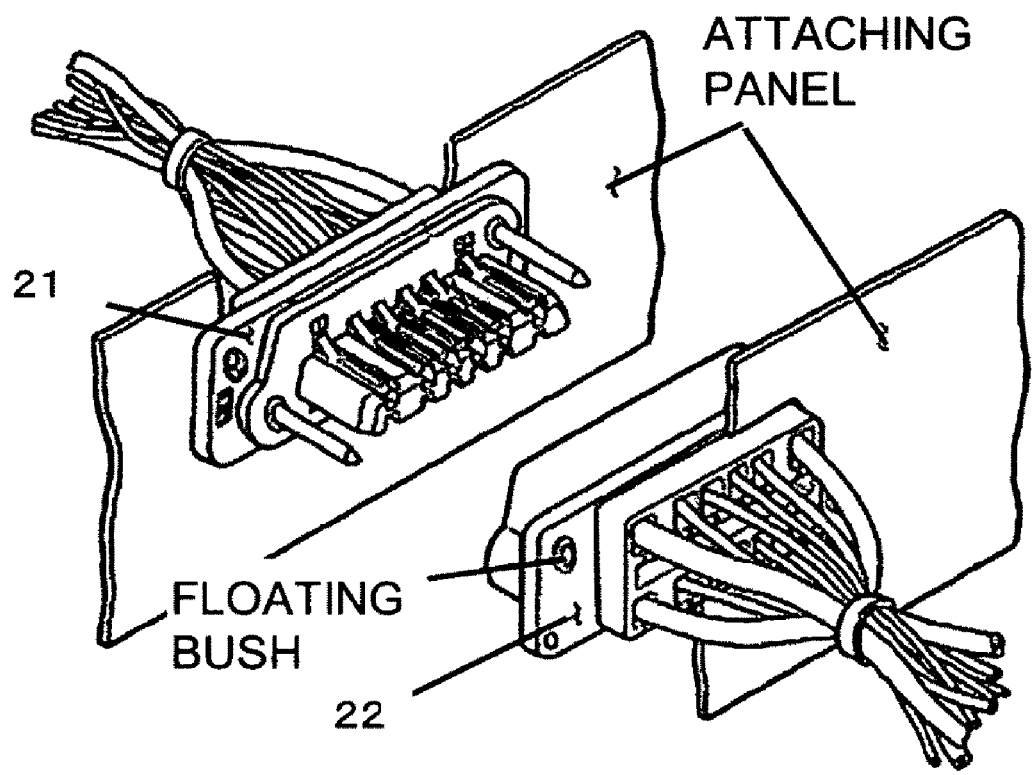
FIG. 6 is a perspective view of a conventional back plug-in connector.

FIG. 5 is a top view in which a convex-shaped guide member 20 of the backboard 18 of the cabinet 16 side and a concave-shaped guide receiving portion 4 of the support plate 1 of the unit 15 side are engaging each other.

According to the present structure, since no elastic support strip as described in Patent Document 2 is used, no damage of the connector caused by a plastic deformation of the elastic support strip would occur. And even when a number of plug pins of the connector increased, the connector may be designed with enough rigidity and therefore no influence would cause because the structure does not utilize elasticity of a component. Thus maintenance such as a replacement of a connector caused by breakage can be reduced.

The present invention was explained referring to an exemplary example above; however, the present invention is not limited to the structure of the exemplary example above explained, and includes various kinds of variations and modifications that a person skilled in the art may conceive within scope of the present invention.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modification aforementioned.

The invention claimed is:

1. A back plug-in connector device having a floating structure, comprising:
   a body chassis, a cover, a support plate on which a connector is mounted and a sub-board, wherein:
   the connector is mounted on the sub-board and the sub-board is attached on the support plate,
   the support plate is sandwiched by the body chassis and the cover so as to constitute the floating structure, the support plate comprises one or more guide pins on an edge surface portion of the support plate, the body chassis comprises one or more groove portions, each of the groove portions engaging a respective of the one or more guide pins with a clearance allowing the guide pin to float in the groove portion, and the one or more guide pins are cylinder-shaped.

2. The connector device as defined in claim 1, wherein an end portion of the cylinder-shaped one or more guide pins are sphere-shaped or semi-sphere-shaped.

3. The connector device as defined in claim 1, wherein at least one of the one or more guide pins which engages a respective of the one or more groove portions is provided on each edge surface of the edge surface portion of the support plate.

4. The connector device as defined in claim 1, wherein a concave-shaped guide receiving portion for positioning at plug-in is provided on the support plate such that the guide receiving portion engages a convex-shaped guide member provided on a backboard of a cabinet side.

5. The connector device as defined in claim 1, wherein the floating structure is constituted such that the support plate having the one or more guide pins is fitted into the body chassis having the one or more groove portions and that the cover is fixed to the body chassis from a same direction as the support plate so as to sandwich the support plate.

6. The connector device as defined in claim 5, wherein an end portion of the cylinder-shaped one or more guide pins are sphere-shaped or semi-sphere-shaped.

7. The connector device as defined in claim 5, wherein at least one of the one or more guide pins which engages a respective of the one or more groove portions is provided on each edge surface of the edge surface portion of the support plate.

8. The connector device as defined in claim 5, wherein a concave-shaped guide receiving portion for positioning at plug-in is provided on the support plate such that the guide receiving portion engages a convex-shaped guide member provided on a backboard of a cabinet side.

* * * * *